United States Patent
Das

(10) Patent No.: US 7,930,602 B2
(45) Date of Patent: Apr. 19, 2011

(54) METHOD AND SYSTEM FOR PERFORMING A DOUBLE PASS NTH FAIL BITMAP OF A DEVICE MEMORY

(75) Inventor: Debaleena Das, Ashland, MA (US)

(73) Assignee: Globalfoundries Inc., Grand Cayman (KY)

( * ) Notice: Subject to any disclaimer, the term of this patent is extended or adjusted under 35 U.S.C. 154(b) by 238 days.

(21) Appl. No.: 12/389,748

(22) Filed: Feb. 20, 2009

(65) Prior Publication Data

US 2010/0218056 A1 Aug. 26, 2010

(51) Int. Cl.
*G11C 29/00* (2006.01)
(52) U.S. Cl. ........................................ 714/723; 714/719
(58) Field of Classification Search .................. 365/201, 365/222; 714/6, 718, 723, 719
See application file for complete search history.

(56) References Cited

U.S. PATENT DOCUMENTS

| | | | |
|---|---|---|---|
| 6,532,182 B2 * | 3/2003 | Ogawa et al. ................. | 365/201 |
| 6,550,023 B1 | 4/2003 | Brauch et al. | |
| 6,643,807 B1 | 11/2003 | Heaslip et al. | |
| 6,971,055 B2 | 11/2005 | Hung et al. | |
| 7,051,253 B2 * | 5/2006 | Rooney et al. ................. | 714/718 |
| 7,181,643 B2 * | 2/2007 | Kaiser et al. ...................... | 714/6 |
| 2006/0028891 A1 * | 2/2006 | Selva et al. .................... | 365/222 |
| 2006/0248414 A1 * | 11/2006 | Dubey ........................ | 714/718 |

* cited by examiner

*Primary Examiner* — David Ton
(74) *Attorney, Agent, or Firm* — Meyertons, Hood, Kivlin, Kowert & Goetzel, P.C.; Stephen J. Curran

(57) ABSTRACT

A method for performing a double pass $n^{th}$ fail bitmap of a memory array of a device under test includes a memory built-in test (MBIST) unit reading previously written data from each location of the memory array during a first pass, and detecting a failure associated with a mismatch between written and read data at each location. The method also includes storing within a storage, an address corresponding to a current failing location in response to determining that a predetermined number of locations have failed. The method further includes the MBIST unit reading the previously written data from each location during a second pass. The method includes locking and providing for output, read data stored at a current read address in response to a match between the current read address and any address stored within the storage.

20 Claims, 3 Drawing Sheets

METHOD AND SYSTEM FOR PERFORMING A DOUBLE PASS NTH FAIL BITMAP OF A DEVICE MEMORY

BACKGROUND OF THE INVENTION

1. Field of the Invention

This invention relates to integrated circuit testing and, more particularly, to built-in self-testing of embedded memories.

2. Description of the Related Art

During development testing of an integrated circuit (IC) that includes a memory array, it is typically important to fully test the memory across various manufacturing process changes. For example, when a device is first manufactured, typically referred to as first silicon, the wafer fabrication process may need to be adjusted to accommodate all processing corners. For devices with memory arrays, a bitmap of the array may be created during memory testing to ensure or establish the various process corners of the process. A bitmap is a mapping of each memory location in a particular memory array. The bitmap may show the pass/fail status of each location, or it may show other data. Generally speaking, a bitmap may be created by test software running on a device test system using pass/fail information, for example, sent to the tester from the device under test during testing. There are various techniques to generate such a bitmap.

However, depending on how the memory array pass/fail information is provided back to the tester, bitmapping large arrays can be test time intensive. For example, in one technique each memory location may be read, and the data and a pass fail indication may be sent to the tester after each read (referred to as normal mode bitmapping). This technique can be very time consuming.

In another technique, known as nth fail mode, each location is read and after some predetermined number (n) of failures the clock is stopped and the data for the current failed location is sent to the tester. Using this technique, testing can be done at-speed. In some cases nth fail mode testing may be done as much as 60 times as fast as normal mode bitmapping. However, there can be significant drawbacks to nth fail mode bitmapping, particularly for high frequency devices. For example, stopping on the nth fail to output the data requires locking of the compare data in the same cycle that the error is detected. To do so in high frequency devices can be expensive in terms of additional hardware overhead (e.g., use of additional "shadow flops" or high power flops) to stop the clock. Alternatively, to reduce the hardware complexity, there are some hardware simplifications such as partial locking, that may be used. But to do so can compromise the bitmap data quality.

SUMMARY

Various embodiments of a method and system for performing a double pass nth fail bitmap of a memory array of a device under test are disclosed. In one embodiment, the method includes a memory built-in test (MBIST) unit reading previously written data from each location of the memory array during a first pass, and detecting a failure associated with a mismatch between written and read data at each location. The method also includes storing within a storage, an address corresponding to a current failing location in response to determining that a predetermined number of locations have failed. The method further includes the MBIST unit reading the previously written data from each location during a second pass. The method includes locking and providing for output, read data stored at a current read address in response to a match between the current read address and any address stored within the storage.

In another embodiment, an MBIST unit of a device including a memory array includes an address generator unit configured to read previously written data from each location of the memory array during a first pass. The MBIST unit also includes a data compare unit coupled to the address generator unit and configured to detect a failure associated with a mismatch between written and read data at each location. The MBIST unit further includes a control unit coupled to the compare unit and configured to store within a storage, an address corresponding to a current failing location in response to determining that a predetermined number of locations have failed. The address generator unit is further configured to read the previously written data from each location during a second pass, and the control unit is further configured to lock the read data stored at a current read address in response to a match between the current read address and any address stored within the storage, and to cause the read data to be provided for output to a device tester.

Figure 1:
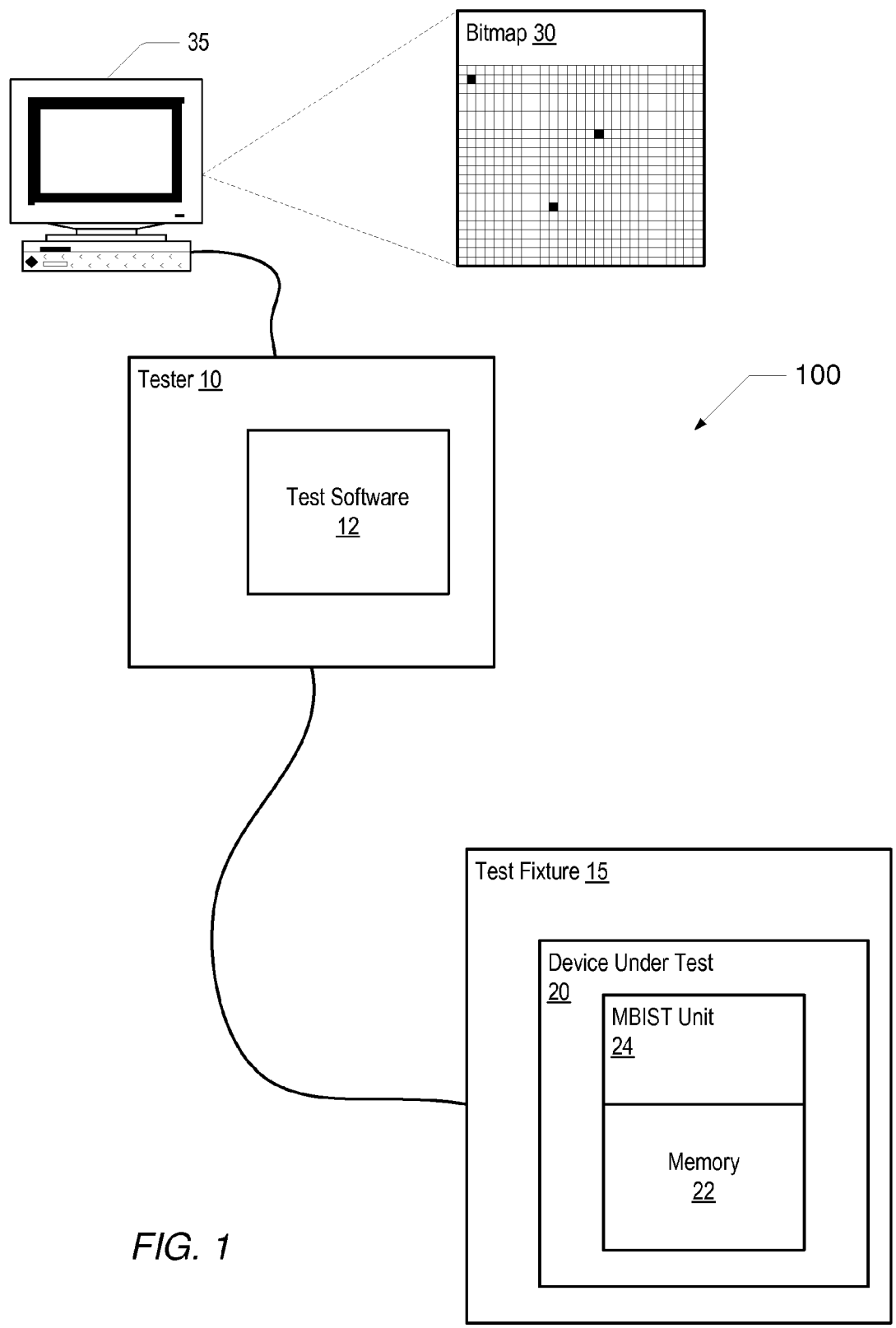
FIG. 1 is a diagram depicting one embodiment of a test system for testing a device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

Turning now to FIG. 1, a diagram depicting one embodiment of a test system for testing a device is shown. The test system 100 includes a tester 10 coupled to a workstation 35 and to a test fixture 15. The tester 10 may execute test software 12 that may be stored locally within the tester 10, remotely within the workstation 35, or it may be stored within a remote server (not shown), as desired. Accordingly, tester 10 may include one or more processors, input/output circuits, and memory (all not shown) as desired to facilitate the testing functions. It is noted that tester 10 may be representative of any of a variety of test systems referred to as automated tests equipment (ATE). However, is also noted that tester 10 may be a simpler test system employing custom hardware (e.g., test fixture 15) and a generalized computing device (e.g., workstation 35).

The test fixture 15 may be representative of any type of test fixture that is configured to contact a device (e.g., device under test (DUT) 20) in such a way as to facilitate testing the DUT 20. The test fixture may include interface circuits, circuit boards, contacts and pins (all not shown) to connect the DUT 20 to tester 10. For example, in some embodiments, the test fixture 15 may hold a single integrated circuit device in a socket, contactor, or other device receiver, while in other embodiments, the test fixture 15 may hold any number of devices in any number of receivers. In addition, the test fixture 15 may be adapted to manually contact one or more devices (e.g., DUT 20) in respective receivers while tests are performed. Alternatively, test fixture 15 may be adapted to contact one or more devices that are placed in position by a machine (e.g., pick and place handler) while the tests are performed.

In the illustrated embodiment, DUT 20 includes a memory 22 and a memory built-in test (MBIST) unit 24. In various embodiments, the MBIST unit 24 may be configured to run a number of self-contained memory tests and diagnostics on the memory 22. More particularly, in one embodiment, during testing of DUT 20, once the MBIST unit 24 is enabled, the MBIST unit 24 may automatically perform the memory tests and provide test results, such as pass/fail data, actual read data, and the like to the tester 10. The memory 22 may be representative of any type of random access memory (RAM) array including static RAM (SRAM) or any type of dynamic RAM (DRAM), among others.

As shown, test system 100 may generate a bitmap 30 of the memory 22 within DUT 20. As mentioned above, the bitmap 30 may be generated based upon the memory array testing performed by the MBIST unit 24, and the data sent back to the tester 10. As described in greater detail below, in one embodiment, during a bitmapping of the memory 22 the MBIST unit 24 may use a two-pass read sequence to provide the bitmap data to the tester 10. In the first pass, the memory is tested by writing and reading back the data. However, no data is sent to the tester 10. Instead, the address of every $n^{th}$ failing location is saved within the MBIST unit 24. During the second pass, the read data corresponding to each of the failed addresses is sent to the tester.

Figure 2:
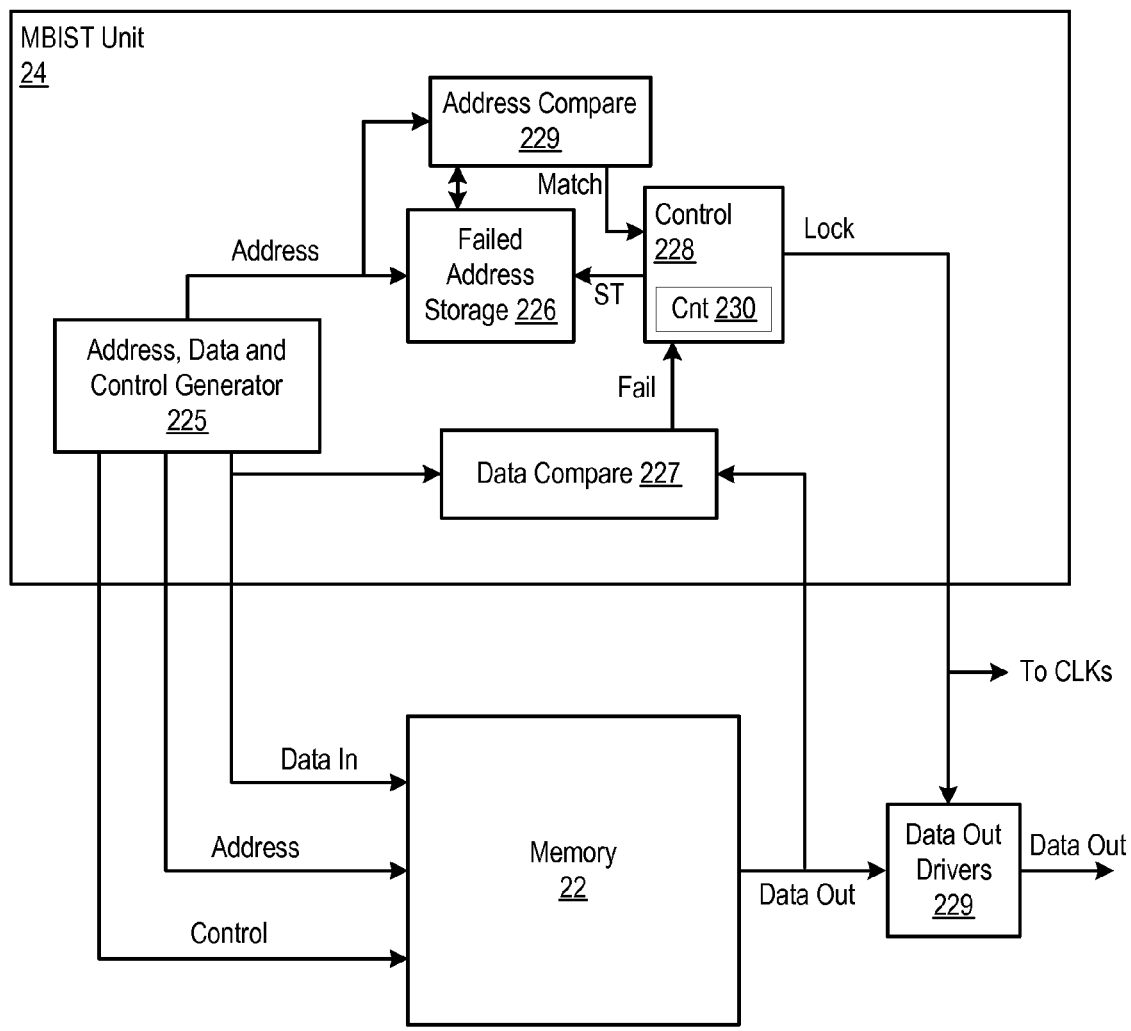
FIG. 2 is a block diagram of a device under test including one embodiment of the memory built-in test unit of FIG. 1.

Referring to FIG. 2, a block diagram of a device under test including one embodiment of the memory built-in test unit of FIG. 1 is shown. DUT 20 includes a memory 22 coupled to an MBIST unit 24, and to data drivers 229. The MBIST unit 24 includes an address, data and control generator ADCG 225 that is coupled to the memory 22. The MBIST unit 24 also includes a data compare unit 227 and an address compare unit 229 as well as a failed address storage unit 226, all of which are coupled to the ADCG 225. The MBIST unit 24 further includes a control unit 228 that is coupled to the address compare unit 229 and the data compare unit 227. It is noted that DUT 20 may be any type of device that includes an embedded memory. For example, DUT 20 may be a processor or microcontroller. Accordingly, DUT 20 may include other components that have been omitted here for simplicity.

As described above, the MBIST unit 24 is configured to run tests and diagnostics on the memory 22. During such testing, in one embodiment, the ADCG 225 generates read and write addresses, data patterns, and control signals for reading and writing to memory 22. The data compare unit 227 is configured to compare data that was supposed to be previously written into memory 22 against data that is read back out. The previously written data may be any known data pattern, while the data read out is the data that was retrieved from memory 22. Accordingly, data compare unit 227 may detect errors in memory 22. As such, data compare unit 227 may provide a fail indication to control unit 228 in response to a mismatch in the data that was read out of memory 22 and the data that was supposed to be written into memory 22.

In one embodiment, control unit 228 may keep track of how many errors have occurred. For example, in one implementation, a counter, designated as CNT 230, may be incremented or decremented to count how many errors data compare unit 227 has detected. Accordingly, during testing, control unit 228 may provide an "ST" signal to the failed address storage 226 each time the CNT 230 reaches a predetermined count value.

As described in greater detail below in conjunction with the description of FIG. 3, in one embodiment, each time the ADCG 225 generates a read address during the first pass of reading memory 22, the address is presented to failed address storage 226. In response to receiving the ST signal, the failed address storage 226 may store that current read address. During the second pass of reading of memory 22, when a current read address is presented to address compare unit 229, address compare unit 229 may compare the current read address with each address stored within failed address storage 226. If a match is found, address compare unit 229 provides a match signal to control unit 228. In response, control unit 228 may provide a lock signal to the data out drivers 229 and CLK circuits of DUT 20. It is noted that the circuit blocks in the embodiment shown in FIG. 2 and described above are merely an exemplary implementation. It is contemplated that other embodiments which have similar functionality are possible and contemplated.

Figure 3:
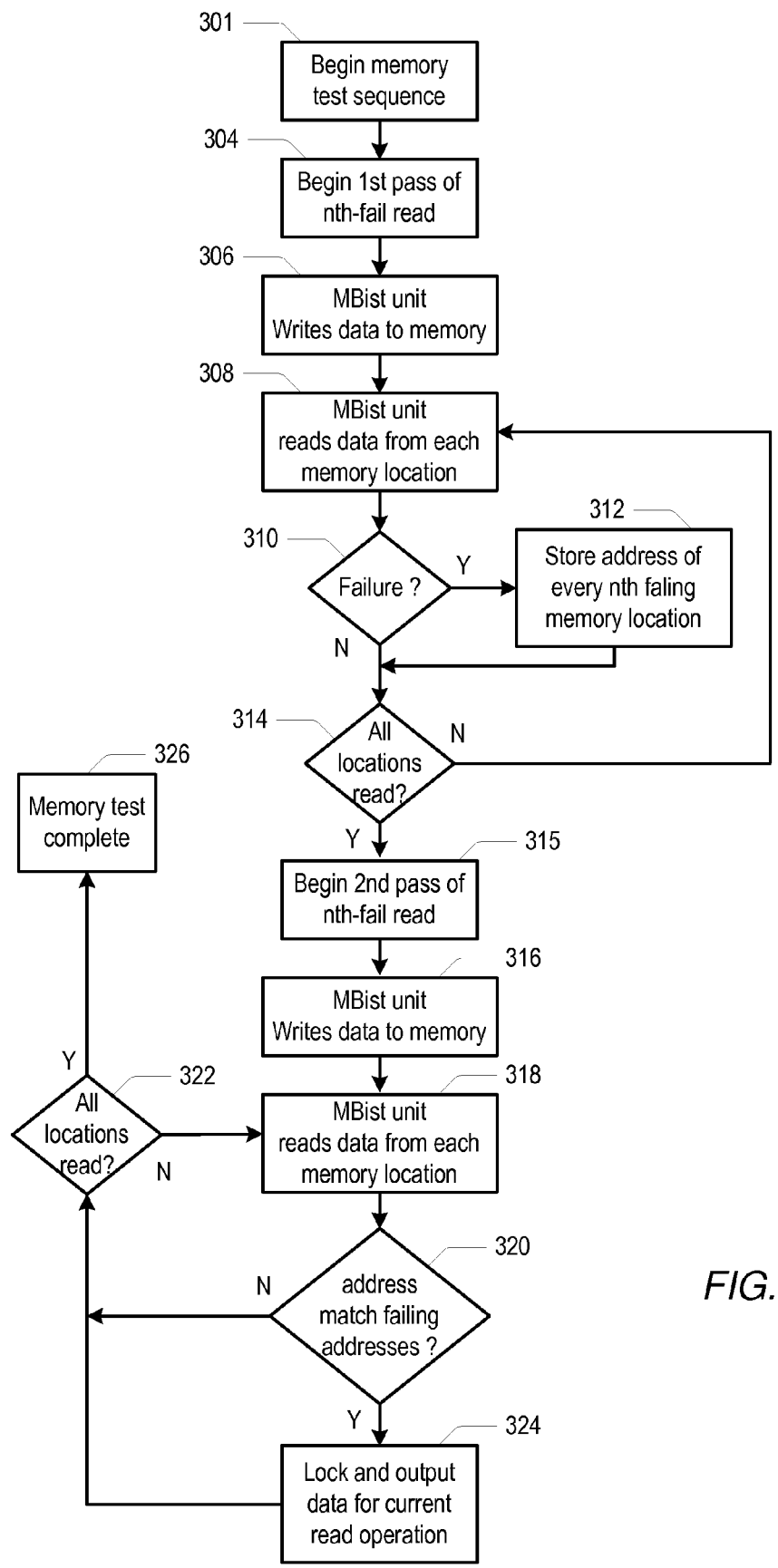
FIG. 3 is a flow diagram describing operational aspects of the memory built-in test unit of FIG. 1 and FIG. 2.

FIG. 3 illustrates a flow diagram describing operational aspects of the embodiments of memory built-in test unit of FIG. 1 and FIG. 2. Referring collectively to FIG. 1 through FIG. 3, and beginning in block 301 of FIG. 3, when a test operator runs the test software 12 executing on tester 10 of FIG. 1, the tester sends signals to the DUT 20 to execute a variety of tests such as an embedded memory test. In one embodiment, the tester 10 may apply a set of signals that cause the DUT 20 to enter a memory test mode in which MBIST unit 24 begins testing memory 22 by beginning a $1^{st}$ pass $n^{th}$ fail read test (block 304). The memory testing sequence includes the MBIST unit 24 writing predetermined data such as a known pattern to memory 22 (block 306). For example, the ADCG 225 may generate the data patterns, and address and control signals to write the data patterns to memory 22.

Accordingly, the ADCG 225 may generate read addresses and control signals so that each location in memory 22 may be read (block 308). As the data at each location becomes available, it is compared against the known data written to that location by, for example, the data compare unit 227. If there is no failure detected (block 310) and if all locations have not been read (block 314), operation continues and each location is read (block 308). If however, a failure is detected (block 310), MBIST unit 24 keeps track of how many failures have occurred since the read data was last output to the tester. For example, in the embodiment shown in FIG. 2, MBIST unit 24 uses a counter such as CNT 230 to count the number of failures. In one embodiment, when the count value reaches a predetermined number of failures, the MBIST unit 24 stores the current read address of the failing location in a storage such as failing address storage 226 (block 312). Then the count value may be reset to the starting value. In one embodiment, the storage 226 may be implemented using a number of registers, although other implementations are possible and contemplated. It is noted that in other embodiments, the counter may instead be initialized to a predetermined value and decremented each time.

Referring back to block 314, if all locations have been read, and each $n^{th}$ failing location address has been stored, the MBIST unit 24 may begin a second pass of the $n^{th}$ fail read test (block 315). As such, the MBIST unit 24 may again write the predetermined data pattern to memory 22 as described above in the description of block 306 (block 316). The MBIST unit 24 may then read the data at each location in memory 22 by generating the appropriate address and control signals (block 318). However, during the second pass, as each current read address is generated, the current read address is compared against all the addresses of failed locations stored in the storage 226 while the memory 22 is being accessed. If there are no matches (block 320) and all locations have been read (block 322), then testing is complete (block 326).

However, referring back to block 320, if there is a matching address, in one embodiment, the control unit 228 within MBIST unit 24 provides a lock signal to clock CLK circuits and output data drivers 229 of DUT 20. The lock signal may stop one or more clock signals in DUT 20 and allow the read data for the current address to be output to the tester 10 when the read data becomes available (block 324). Once again, if all locations have not been read (block 322), operation continues as described in the description of block 318 where each memory location is read. Similarly, when all the locations have been read (block 322), the memory test may be complete and the tester 10 may generate the bitmap 30 of the memory 22.

Thus, by performing a two-pass $n^{th}$ read memory test, the read data corresponding to the $n^{th}$ fail can be locked in the same cycle as it is read from the memory array without high overhead of many additional special flip-flops or sacrificing bitmap quality. In the $1^{st}$ pass, the read may be performed at-speed and an $n^{th}$ failed address may be stored as the next read is generated. In the $2^{nd}$ pass, as the memory is accessed, the current read address is compared concurrently with the read access. The address compare can be accomplished well within the time it takes to for the read data to become available. Thus, the read data can be locked in the same cycle that it is available and then dumped to the tester.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for bitmapping a memory array of a device under test, the method comprising:
   a memory built-in test (MBIST) unit reading previously written data from each location of the memory array during a first pass;
   the MBIST unit detecting a failure associated with a mismatch between written and read data at each location;
   storing within a storage, an address corresponding to a current failing location in response to determining that a predetermined number of locations have failed;
   the MBIST unit reading the previously written data from each location during a second pass;
   locking and providing for output, read data stored at a current read address in response to a match between the current read address and any address stored within the storage.

2. The method as recited in claim 1, further comprising comparing the current read address with each address stored within the storage.

3. The method as recited in claim 1, further comprising serially shifting the read data out of the device under test using a scan chain.

4. The method as recited in claim 1, further comprising generating the bitmap from the read data.

5. The method as recited in claim 1, further comprising storing the predetermined number of locations in a counter.

6. The method as recited in claim 1, wherein the storage comprises a plurality of registers.

7. The method as recited in claim 1, wherein locking comprises latching the read data stored at the current read address, and stopping one or more device clocks.

8. A memory built-in test (MBIST) unit of a device including a memory array, the MBIST comprising:
   an address generator unit configured to read previously written data from each location of the memory array during a first pass;
   a data compare unit coupled to the address generator unit and configured to detect a failure associated with a mismatch between written and read data at each location;
   a control unit coupled to the compare unit and configured to store within a storage, an address corresponding to a current failing location in response to determining that a predetermined number of locations have failed;
   the address generator unit is further configured to read the previously written data from each location during a second pass;
   wherein the control unit is further configured to lock the read data stored at a current read address in response to a match between the current read address and any address stored within the storage, and to cause the read data to be provided for output to a device tester.

9. The MBIST unit as recited in claim 8, further comprising an address compare unit configured to compare the current read address with each address stored within the storage.

10. The MBIST unit as recited in claim 8, wherein the read data is output by serially shifting the read data out of the device using a scan chain.

11. The MBIST unit as recited in claim 8, wherein the bitmap is generated by test software executing on a test system based upon the read data received from the device.

12. The MBIST unit as recited in claim 8, wherein the control unit includes a counter configured to store a count value corresponding to the predetermined number of locations.

13. The MBIST unit as recited in claim 8, wherein the storage comprises a plurality of registers.

14. The MBIST unit as recited in claim 8, wherein locking comprises latching the read data stored at the current read address, and stopping one or more device clocks.

15. A test system comprising:
   a device tester configured to execute test software and to generate a bitmap; and
   a test fixture configured to interface a device to the device tester;
   wherein the device comprises:
      a memory array including a plurality of locations;
      a memory built-in test (MBIST) unit coupled to the memory array and configured to:
         read previously written data from each location of the memory array during a first pass;
         detect a failure associated with a mismatch between the previously written data and read data at each location;
         store within a storage, an address corresponding to a current failing location in response to determining that a predetermined number of locations have failed;
         read the previously written data from each location during a second pass;
         lock and provide for output to the device tester, read data stored in the location corresponding to a current read address in response to a match between the current read address and any address stored within the storage;

wherein the device tester is further configured to generate the bitmap based upon the read data received from the device memory array.

16. The test system as recited in claim 15, wherein the MBIST unit includes an address compare unit configured to compare the current read address with each address stored within the storage.

17. The test system as recited in claim 15, wherein the read data is output by serially shifting the read data out of the device using a scan chain.

18. The test system as recited in claim 15, wherein the bitmap is generated by test software executing on the test system based upon the read data received from the device.

19. The test system as recited in claim 15, wherein the MBIST unit includes a counter configured to store a count value corresponding to the predetermined number of locations.

20. The test system as recited in claim 15, wherein the storage comprises a plurality of registers.

* * * * *